US012732150B2

(12) United States Patent
Merlin et al.

(10) Patent No.: US 12,732,150 B2
(45) Date of Patent: Sep. 8, 2026

(54) APPARATUSES AND METHODS INVOLVING SIGNAL TRANSFORMATION FOR SINGLE-ENDED COUPLING

(71) Applicant: NXP B.V., Eindhoven (NL)

(72) Inventors: Erich Merlin, Gratkorn (AT); Manoj Kurvathodil, Graz (AT)

(73) Assignee: NXP B.V., Eindhoven (NL)

( * ) Notice: Subject to any disclaimer, the term of this patent is extended or adjusted under 35 U.S.C. 154(b) by 792 days.

(21) Appl. No.: 18/082,352

(22) Filed: Dec. 15, 2022

(65) Prior Publication Data

US 2024/0204743 A1 Jun. 20, 2024

(51) Int. Cl.

| | |
|---|---|
| ***H03H 7/38*** | (2006.01) |
| ***G06K 7/10*** | (2006.01) |
| ***H01Q 1/22*** | (2006.01) |
| ***H03H 7/42*** | (2006.01) |
| ***H04B 1/40*** | (2015.01) |
| ***H04B 5/00*** | (2024.01) |
| ***H04B 5/72*** | (2024.01) |

(52) U.S. Cl.

CPC ................ *H03H 7/38* (2013.01); *H03H 7/42* (2013.01); *H04B 1/40* (2013.01); *H04B 5/72* (2024.01)

(58) Field of Classification Search

None

See application file for complete search history.

(56) References Cited

U.S. PATENT DOCUMENTS 7,626,472 B2 * 12/2009 Davies-Venn ......... H05K 1/165 333/185
7,683,733 B2 * 3/2010 Li ........................... H01F 19/04 333/25
8,818,297 B2 * 8/2014 Merlin ..................... H04B 5/79 455/73
9,379,778 B2 * 6/2016 Roh ......................... H04B 5/77
9,613,238 B2 * 4/2017 Cho ................... G06K 7/10237
9,641,227 B2 * 5/2017 Moon ...................... H04B 5/48
9,729,210 B2 * 8/2017 Jensen .................... H04W 4/80
9,893,751 B2 * 2/2018 Bando .................. H04B 1/0458
9,985,693 B2 * 5/2018 Moon ...................... H03H 7/38
10,516,445 B2 * 12/2019 Hueber .................... H04B 5/24
11,038,553 B2 * 6/2021 Ding ........................ H04B 5/79

(Continued)

OTHER PUBLICATIONS

M. Roland, H. Witschnig, E. Merlin and C. Saminger, "Automatic impedance Matching for 13.56 MHz NFC Antennas," 2008 6th International Symposium on Communication Systems, Networks and Digital Signal Processing, 2008, pp. 288-291.

(Continued)

*Primary Examiner* — Tuan A Tran

(57) ABSTRACT

In one example, the present disclosure includes a circuit-based apparatus including a resonance tank circuit, a signal source, and a single-ended circuit. The signal source provides a plurality of complementary signals (e.g., differential signals) for processing by the resonance tank circuit where the complementary signals are combined to a signal at a node for presentation to the single-ended circuit (e.g., antenna or receiver). For example, the resonance tank circuit, which has a resonance frequency set for a transfer of power to the load and which may be impedance matched to the single-ended circuit, converts the complementary signals to the node for carrying the signal to the single-ended circuit.

20 Claims, 5 Drawing Sheets

(56) References Cited

U.S. PATENT DOCUMENTS

| | | | | |
|---|---|---|---|---|
| 11,043,751 | B2 * | 6/2021 | Antonetti | H04W 4/80 |
| 12,130,980 | B2 * | 10/2024 | Ding | G06F 3/03547 |
| 12,401,122 | B2 * | 8/2025 | Huang | H04B 5/43 |
| 2018/0269560 | A1 * | 9/2018 | Ding | H01Q 1/50 |

OTHER PUBLICATIONS

STMicroelectronics NV. AN5592: "ST25R single ended antenna matching," Rev 1—Mar. 2021, pp. 1-23.
NXP B.V. AN11755: "PN7150 Antenna Design and Matching Guide," Rev. 1.7—Jul. 10, 2019, pp. 1-79.

* cited by examiner

APPARATUSES AND METHODS INVOLVING SIGNAL TRANSFORMATION FOR SINGLE-ENDED COUPLING

OVERVIEW

Aspects of various embodiments are directed to circuits for transforming a set of differential signals between circuits and antenna-type loads, or other types of loads.

An NFC controller (near-field-communication controller) is an exemplary one of many types of circuits which is often used with a differential transmitter (TX) driver for producing an output signal (e.g., as a square wave) which may be connected to an NFC antenna via a filter and matching network. An NFC antenna could be operated either in a differential or single ended arrangement. Single ended signals have an advantage over differential antenna arrangement in terms of size and components needs for filter and matching network. Another common scenario where single ended antennas are used in NFC contexts is when the antenna segment on a mobile device is shared between NFC and radio access technologies.

In certain currently-used implementations of the above type, oftentimes a differential TX driver is matched to a single ended antenna using a balun component which permits for balanced and unbalanced lines to be interfaced without disturbing the impedance arrangement of either line. For example, a transformer or autotransformer is commonly used as a balun component to translate a balanced signal output from the differential TX driver to unbalanced signal which, in turn is used to drive the single-ended antenna. Certain examples of specific balun components have current ratings which are either at par or below the maximum operating current of the TX driver, and this limitation can constrain operating at peak antenna power and also increase antenna power by lower matching impedance. Use of balun components are also known to introduce insertion loss which again limits antenna power and requires printed circuit board (PCB) layout considerations to mitigate self heating which, along with component footprint, consumes a large portion of PCB area (e.g., one third of an area allotted for the differential TX driver). In addition, the overall costs associated with such balun components (the component itself plus the filter and matching components) oftentimes contribute to approximately 50% of the bill-of-materials cost.

These and other matters have presented challenges to efficiencies of circuits used for transforming a set of differential signals between circuits and respective loads, for a variety of applications.

SUMMARY

Various example embodiments are directed to issues such as those addressed above and/or others which may become apparent from the following disclosure. For example, in certain example implementations aspects of the present disclosure are directed to differential TX-to-single-ended circuitries which use a topology or architecture (e.g., which may permit for tuning) to realize matching of an output from a differential TX matching circuit without a balun, thereby significantly reducing costs, circuit board real estate and related considerations such as those discussed above.

In one type of example embodiment, the present disclosure is directed to a circuit-based apparatus including a signal source for presenting complementary signals for their conversion to a single-ended circuit such as a load. In one particular instance, a signal driver provides a plurality of complementary signals (e.g., differential signals) to a resonance (tank) circuit where the complementary signals are combined at a node to provide a representative signal for presentation to a single-ended load (e.g., an antenna, amplifier, or receiver). The resonance tank circuit has a resonance frequency set for a transfer of power to the load (and may be impedance matched to the load) and is configured to convert the complementary signals to a signal at the node for presentation of the signal to the single-ended load.

In certain specific example embodiments, aspects of the present disclosure involve a circuit architecture which uses a differential transmitter (TX) connected to a resonance (e.g., tank) circuit, with the tank circuit: transforming a source side of the tank circuit, having a low voltage and low impedance source, to an equivalent high voltage high impedance node at a tap point on an output side of the tank circuit; and/or being tuned or tunable to a resonant frequency ($F_{res}$), and signal-conditioning circuitry such as a single-ended filter (and/or an impedance transformer network) connected to an output of the resonant circuit.

In certain other example embodiments, aspects of the present disclosure involve a tuning method for realizing impedance matching between a signal driver (which generates the complementary outputs) and the single-ended load (e.g., single-ended antenna). In one example, such a method includes setting a resonance tank circuit to have a resonance frequency for a transfer of power in a plurality of complementary signals from a signal driver, through the resonance tank circuit, to a signal at a node from which the signal representing a combination of the plurality of complementary signals is carried to the single-ended load. The method may include the signal driver transmitting or providing the plurality of complementary signals in differential form, and the antenna wirelessly transmits a signal, which corresponds to or is derived from the signal at the node, from the antenna.

Further, the exemplary method may further include using a NFC (near-field communication) transmitter which has, as the plurality of complementary signals, a pair of differential signal outputs TX1 and TX2, and wherein an effective complex impedance is presented to the outputs, and the method further includes tuning values of components via an impedance matching process to cause a complex conjugate load presented to TX1 and TX2.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1A:
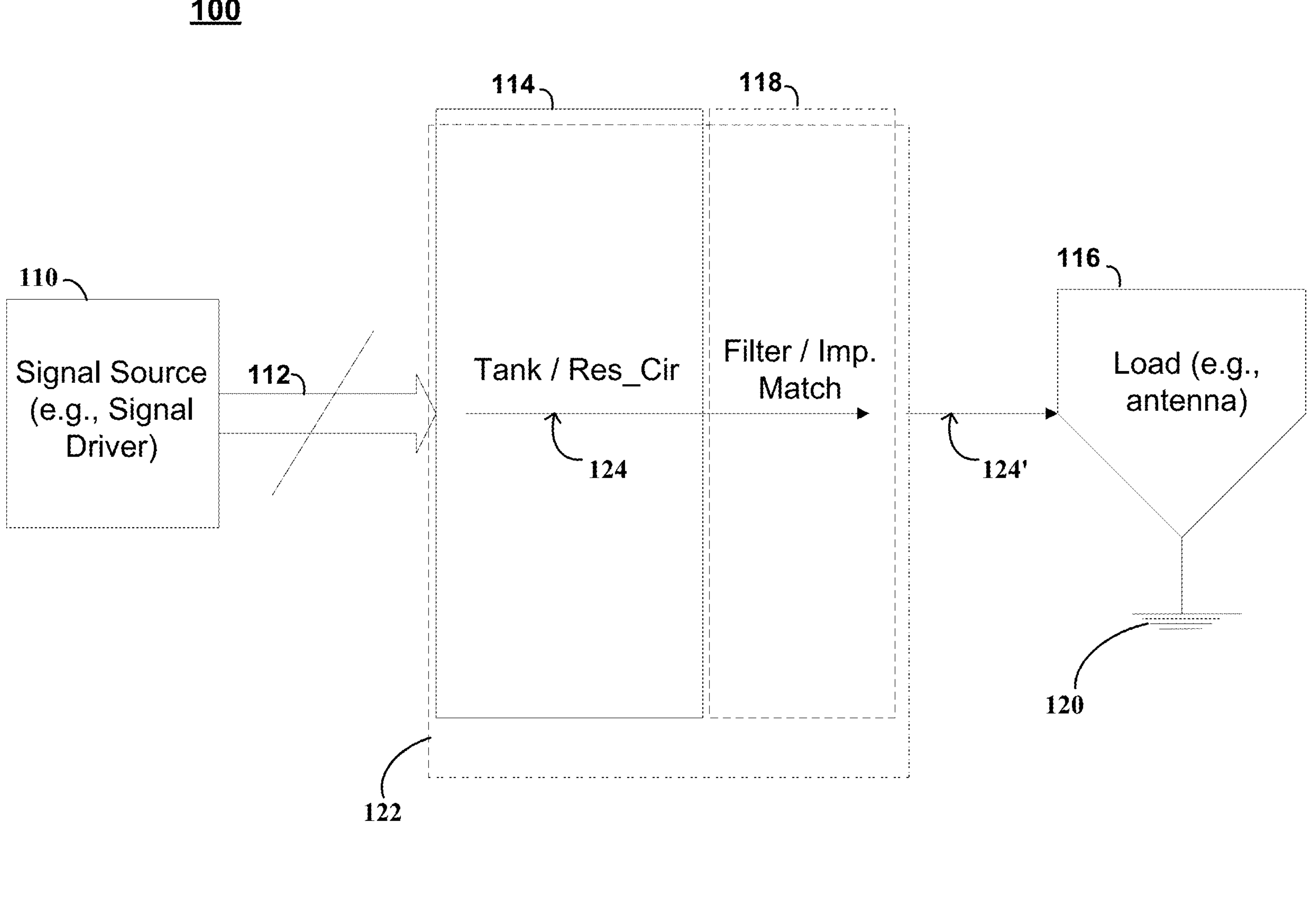
FIG. 1A is an example of circuit topology or architecture, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving conversion (aka transformation) of complementary signals to single-ended signals and circuitries. For examples, such aspects involve this type of conversion in a topology or architecture to realize matching of an output from a transmitter circuit without a balun, thereby significantly reducing costs, circuit board real estate and related considerations such as previously-used circuits which have employed baluns for such transformation. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In one type of example embodiment, the present disclosure is directed to a circuit-based apparatus including a signal driver, including a single-ended load such as an antenna, and including a resonance (tank) circuit. The signal driver provides a plurality of complementary signals (e.g., differential signals) to the tank circuit where the complementary signals are combined to provide a signal at a node for presentation of the signal to the load. The resonance tank circuit, which has a resonance frequency set for a transfer of power to the load and which may be impedance matched to the load, converts the complementary signals to a signal at a node for presentation of the signal to a single-ended circuit to the load.

As another example, the present disclosure concerns a signal conversion method which uses a resonance tank circuit having a resonance frequency set for a transfer of power in the plurality of complementary signals, for converting between the complementary signals and a signal at a node for presentation of the signal to a single-ended circuit-based load. As with the previously-discussed example, this example may also be directed to the plurality of complementary signals being provided by a signal source such as in the form of a signal driver and the single-ended load such as in the form of an antenna. Alternatively, the previously-discussed example as well as this example may have the plurality of complementary signals being provided by a signal source being in the form of an antenna (which provides the complementary signals) and the single-ended load being in the form of an active receiver such as an NFC circuit.

In yet another example, the present disclosure concerns a signal conversion method which uses resonance tank circuits arranged in parallel, each having a resonance frequency set for a transfer of power in the plurality of complementary signals and each for converting between the complementary signals and a signal at a node for presentation of the signal to a single-ended circuit-based load. This example may be seen as effectively combining aspects of the previously-discussed examples, but in this example there is a transceiver circuit (e.g., as part of a radio-frequency (RF) communication device communicating modulated signals converted from differential signal pair to a single-ended signal for transmission via a single-ended antenna) that functions as a source of the plurality of complementary signals for a first one of the parallel-arrangement of resonance tank circuits and that also functions as a load, in the form of a receiver, to receive a single-ended signal from an output of a second one of the resonance tank circuits. As a more specific example in this regard, an antenna circuit includes a single-ended antenna as a load coupled to the node and output of the first one of the resonance tank circuits, and also includes a differential-signal antenna as a signal source for the second one of the resonance tank circuits. In this example, the transceiver circuit may be implemented using an NFC circuit or controller (NFCC).

In a more specific example embodiments, the present disclosure is directed to a circuit topology or architecture which includes: a resonant tank circuit configured for converting two transmit signals (such as differential signals TX1 and TX2) by using the resonant tank circuit tuned to a $F_{res}$, using a filter to suppress higher order frequencies by choosing components based on the signal shape at the transmitter outputs; and an impedance-transformation network with selected capacitances to provide impedance transformation from load impedance presented by an antenna segment to an output impedance of a preceding stage. As yet more specific examples, such a circuit topology or architecture may be exemplified by an L shaped topology and/or other topologies such as II-shaped or T-shaped and with either inductive or capacitive elements.

In certain other example embodiments, aspects of the present disclosure involve a tuning method for realizing impedance matching between a signal source which generates the complementary outputs and a single-ended load such as a single-ended antenna or single-ended receiver. In one such example, a method includes setting a resonance tank circuit to have a resonance frequency for a transfer of power in a plurality of complementary signals from a signal driver, through the resonance tank circuit, to a node from which a signal representing the plurality of complementary signals being combined, for presentation to the load. The method may include the signal driver transmitting or providing the plurality of complementary signals in differential form, and the load in the form of an antenna wirelessly communicating signals.

In related example implementations, aspects of the present disclosure are directed to such a topology or architecture which is not constrained by increased antenna power, which reduces filter and matching components leading to denser placement and reduced bill of material (thereby lowering costs and PCB savings), and/or which exhibits performance at par with balun-matched-impedance system.

FIG. 1A illustrates an example of a circuit architecture or topology via a block diagram of circuit 100, in accordance with the present disclosure where one or more sets of complementary signals are combined to provide a signal, without use of a balun circuit, for presentation of the signal to a single-ended load. The circuit 100 may be part of any of a number of different circuit-based apparatuses, such as a handheld device including a radio-frequency transceiver or a fixed communication station including a communications circuit which is benefited by transforming complementary signals 112 to a signal at a node for presentation of the signal to a single-ended load 116. In this particular example, the circuit 100 includes a signal source 110, a resonance tank circuit 114 or 122, and a load 116. The signal driver provides a plurality of complementary signals to a node within or at proximity of a resonance (tank) circuit where the complementary signals are combined to provide a signal at a node for presentation of the signal to a single-ended circuit such as a load. The plurality of complementary signals may be in any of various forms such as one or more sets of differential signals (e.g., 180 degrees out of phase) or, alternatively, a set of three signals which are 120 degrees out of phase.

In specific embodiments, the resonance tank circuit has a resonance frequency set for a transfer of power to the single-ended load. Further, and which may be impedance matched to the load, the complementary signals are converted to a signal at a node for presentation of the signal to a single-ended circuit such as the load. The load 116 may be an antenna, a receiver, an active circuit such as an operational amplifier, or another signal coupler which uses the energy of the signal delivered along the signal path from the tank circuit 114 or 122 with a reference for the signal (e.g., shown in this example as ground or common at 120). In FIG. 1A, the signal is shown generally passing through block 122 as signal 124 and/or 124', with signal 124' corresponding to the signal 124 in the event that intervening circuitry would modify a signal 124.

In applications where impedance matching to the load 116 is deemed important, the circuit 100 may include a set of signal-filtering and/or impedance-matching components which are to provide respectively a specified amount of signal filtering and/or the impedance resonance to the load 116. The tank circuit may be designed with components to provide such signal filtering and/or impedance matching as depicted using "122", and/or may be complemented with one or more separate circuits depicted using "118" (separate from the tank circuit) to provide the signal filtering and/or impedance matching.

Figure 1B:
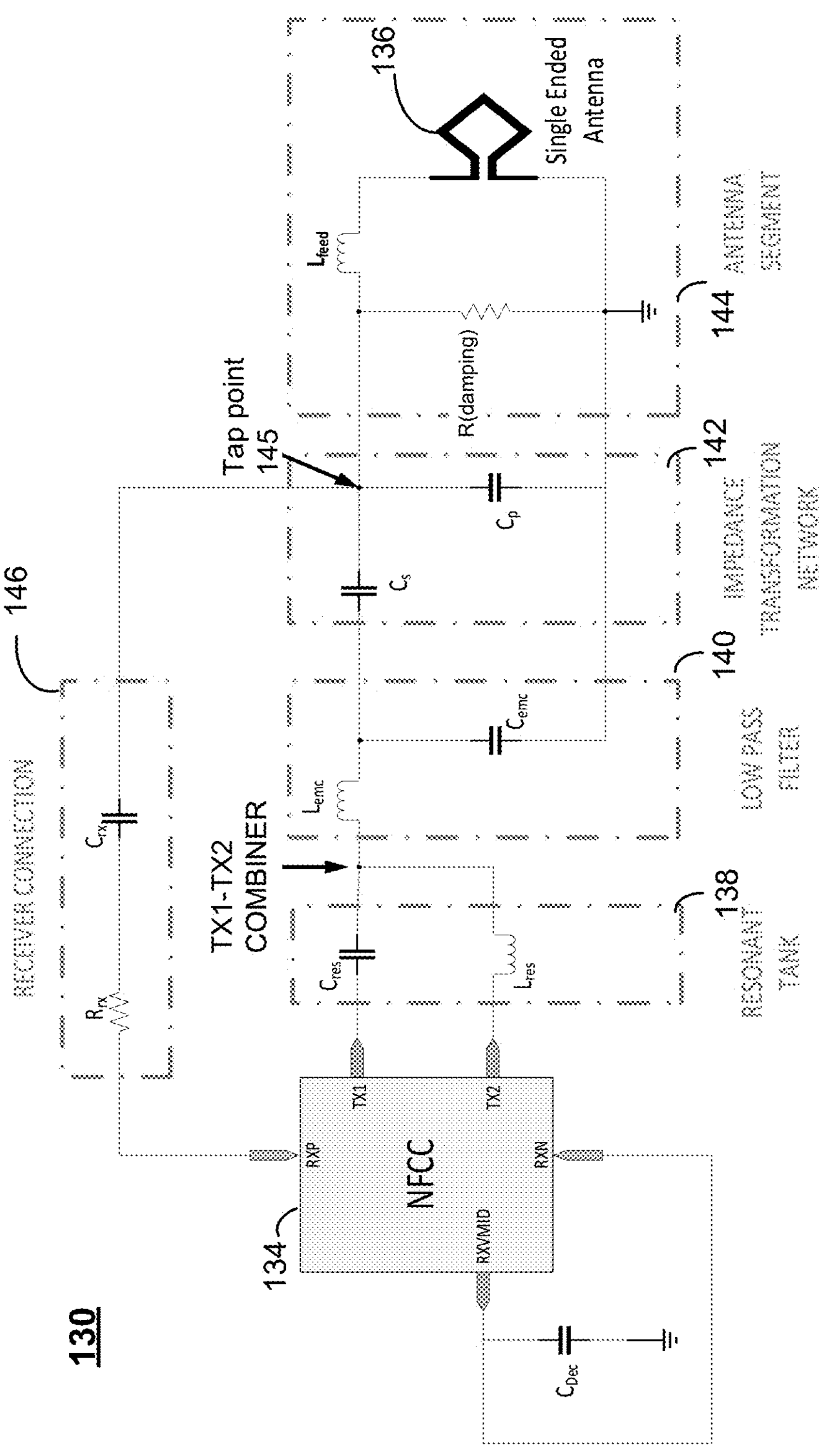
FIG. 1B is an example of circuit topology or architecture, in accordance with the present disclosure.

FIG. 1B, which is also in accordance with the present disclosure, illustrates a schematic to show one specific example manner in which a circuit corresponding to the block diagram of FIG. 1A may be implemented. This specific example, as represented by circuit 130, includes a differential TX driver 134 (with differential outputs TX1 and TX2) in the form of a near-field-communications controller (NFCC or more generally NFC circuit) and, as the load, a single-ended antenna 136. Any of various NFC circuits may be used in this regard (e.g., including those commercially available from NXP Semiconductor, Inc.) as may be appropriate depending on the design specifications and uses, as may be indicated by the following particular (non-limiting) examples handheld-use-endpoint devices such as smartphones and tablets, and applications such as those involving automobiles.

The exemplary circuit 130 also includes a resonant tank 138 including inductive and capacitive component values $C_{res}$ and $L_{res}$, a filter (e.g., low-pass or band pass) 140, an impedance-transformation network 142 and a single-ended antenna segment 144 which forms part of or drives the antenna 136. The resonant tank 138 includes a capacitor ($C_{res}$) and an inductor ($L_{res}$) which, together, define the frequency at which the circuit 130 is to resonate (aka resonance frequency). These components receive complementary signals TX1 and TX2. At the other sides of the capacitor ($C_{res}$) and the inductor ($L_{res}$) is a node at which the complementary signals are combined, with $C_{res}$ and $L_{res}$ connected to TX1 and TX2 and respectively tuned to a resonance frequency Fres. The low pass filter 140 may be formed by an inductor $L_{emc}$ and a capacitor $C_{emc}$ for forming such a filter of the $2^{nd}$ order. Element $C_S$ and $C_P$ provide the impedance transformation from load impedance, presented by the antenna segment 144, to output impedance of the filter 140. The antenna segment 144 in this instance includes optional components as $R_{Damping}$ which is damping resistor to change Q of Antenna, could also be placed in series to Antenna, and $L_{feed}$ which provides a feed inductance to separate frequency bands in cases where the antenna segment is shared between NFC and radio-access technologies.

In this context, the node may be referred to a TX1-TX2 combiner. From this junction after the resonant tank 138, a signal is provided for presentation to a filter 140 (e.g., a low-pass filter or in some instances bandpass filter) which is used to pass the resonance frequency and to block frequencies higher than the resonance frequency (e.g., harmonics, noise).

The impedance-transformation network 142 includes capacitive circuitry/components (e.g., capacitors $C_S$ and $C_P$) to present the signal to the antenna segment 144. The antenna segment 144 includes a damping resistor between ground (or common) and the path carrying the converted signal, and further includes an inductor ($L_{feed}$) which is used to feed the converted signal, while being dampened to the single-ended antenna 136.

In certain implementations according to aspects of the present disclosure, the signal driver (or NFCC in the example of FIG. 1B) includes an RXP input which may be used to tap a receive signal in response to feedback from the load (e.g., single-ended antenna). For example, this receive signal may be a signal received from a single-ended antenna such as 136 of FIG. 1B (e.g., with the signal being conveyed through the antenna 136 as part of a communication protocol involving circuit 130 and another circuit not shown). As shown in the example of FIG. 1B, the feedback signal in this instance maybe be picked up at a receiver tap point 145 in the path connecting $C_S$ and $L_{feed}$. Other tap points may be used as well. Instead of connecting this feedback signal directly from the receiver tap point to the RXP input of the NFCC 134, the feedback signal may be processed by a receiver-connection circuit 146, which includes a capacitor and a resistor in series with values set to pass only signals of a certain frequency and amplitude (e.g., as may be specified by the particular requirements of the signal driver or NFCC 134). The resistor ($R_{rx}$) is at the receiver input to avoid saturation of receiver (e.g., at RXP in this case), and $C_{rx}$ is a DC blocking capacitor.

Figure 1C:
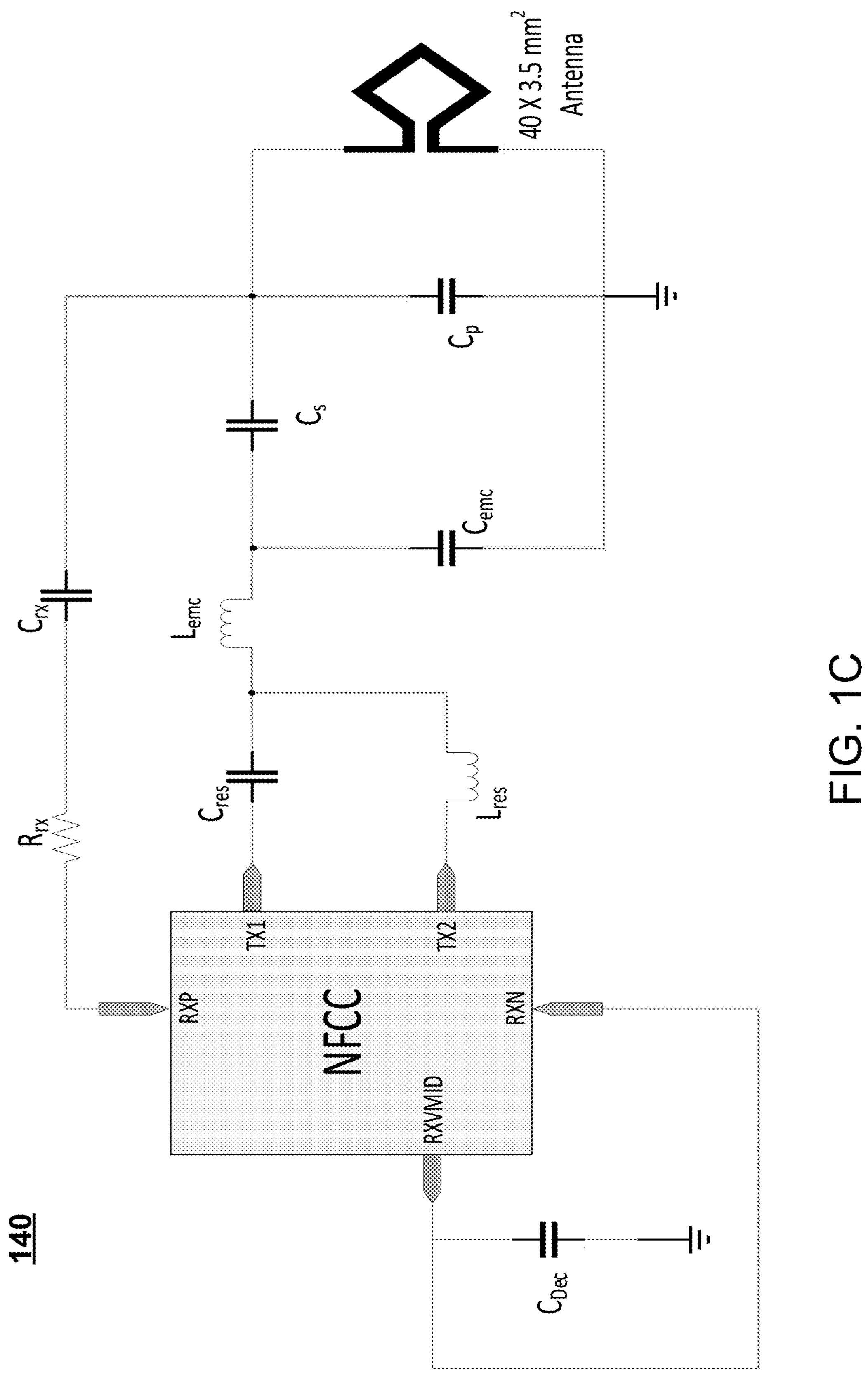
FIG. 1C is another example of circuit topology or architecture, in accordance with the present disclosure.

As there are a number of variations to those which are shown and/or discussed in connection with FIGS. 1A and 1B, FIG. 1C illustrates one such variation. The circuit 140 of FIG. 1C is similar to the circuit 130 of FIG. 1B and generally includes the same components. As non-limiting examples, each of the following components from FIG. 1B may be used as part of the circuit 140 of FIG. 1C: a differential TX driver (or NFC circuit) 134, load (single-ended antenna) 136, resonant tank 138, filter (e.g., low-pass or band pass) 140, and impedance-transformation network 142. A difference between the circuits 130 and 140 of FIG. 1C is that circuit 140 does not include an antenna segment such as 144 of FIG. 1B. Rather, an impedance-transformation network 142 (also depicted by capacitors $C_S$ and $C_P$) is used to present the converted signal directly to the single-ended antenna shown at the far right of the circuit 140 of FIG. 1C. Again, as is the case with the example of FIG. 1B, the circuit 140 of FIG. 1C uses a resonance tank circuit to facilitate conversion of the plurality of complementary signals to a signal for presentation to a single-ended circuit, for example, as opposed to using a balun to effect the conversion.

Figure 2:
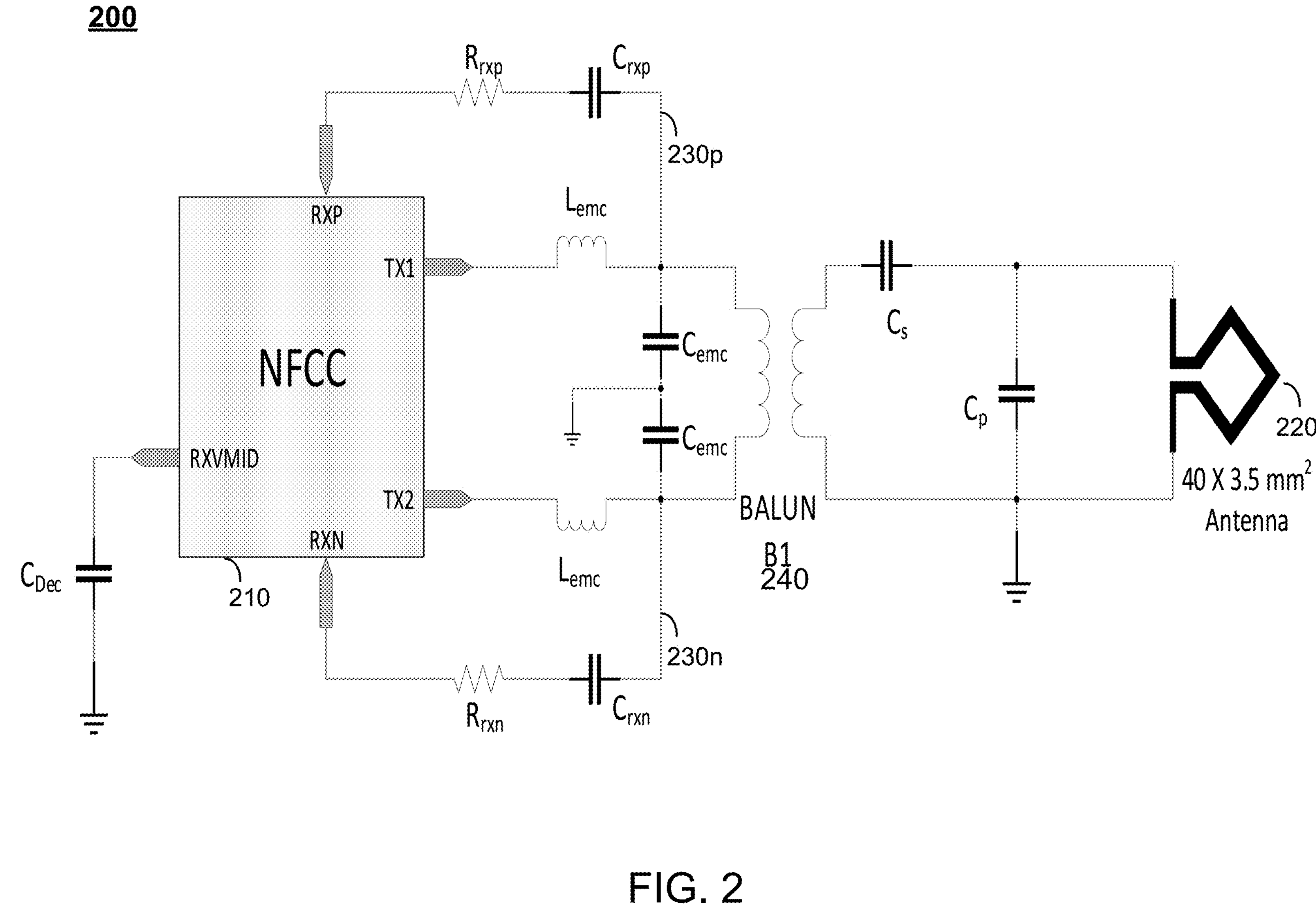
FIG. 2 is an example of a previously-known circuit topology or architecture.

FIG. 2 presents a circuit 200 as an example of circuit that uses a balun (B1) 240 to effect conversion of complementary differential signals to a signal at a node for presentation of the signal to a single-ended circuit. The circuit 200 does not include a tank circuit as described above. However, in a manner which may appear functionally similar to the appearance of respective circuit 140 of FIG. 1C, the circuit 200 also includes an NFCC 210, an antenna 220 as a load, and with the load being driven by an impedance matching network ($C_s$ and $C_P$). The circuit 200 of FIG. 2 also includes feedback signals, as processing through positive-phase and negative-phase signal-modifying circuitry 230*p* and 230*n*, as feedback from the load. Previous implementations of NFC controllers (e.g., NFCC 210) include both an RXP input and an RXN input in anticipation of a balun being used to effect the conversion to the single-ended antenna such as 220.

Advantageously and readily apparent upon reviewing and comparing the previously-known circuit of FIG. 2 with either of the example circuits shown in FIGS. 1B and 1C (the latter of which are balun-less), the balun-type topology as in FIG. 2 (which also connects a differential TX to a single ended antenna), has more components and this leads to less dense placement (more PCB real estate being consumed) and increased bill of materials (cost) compared to balun-less matching topologies according to the present disclosure, as in FIGS. 1A, 1B and 1C.

Figure 3:
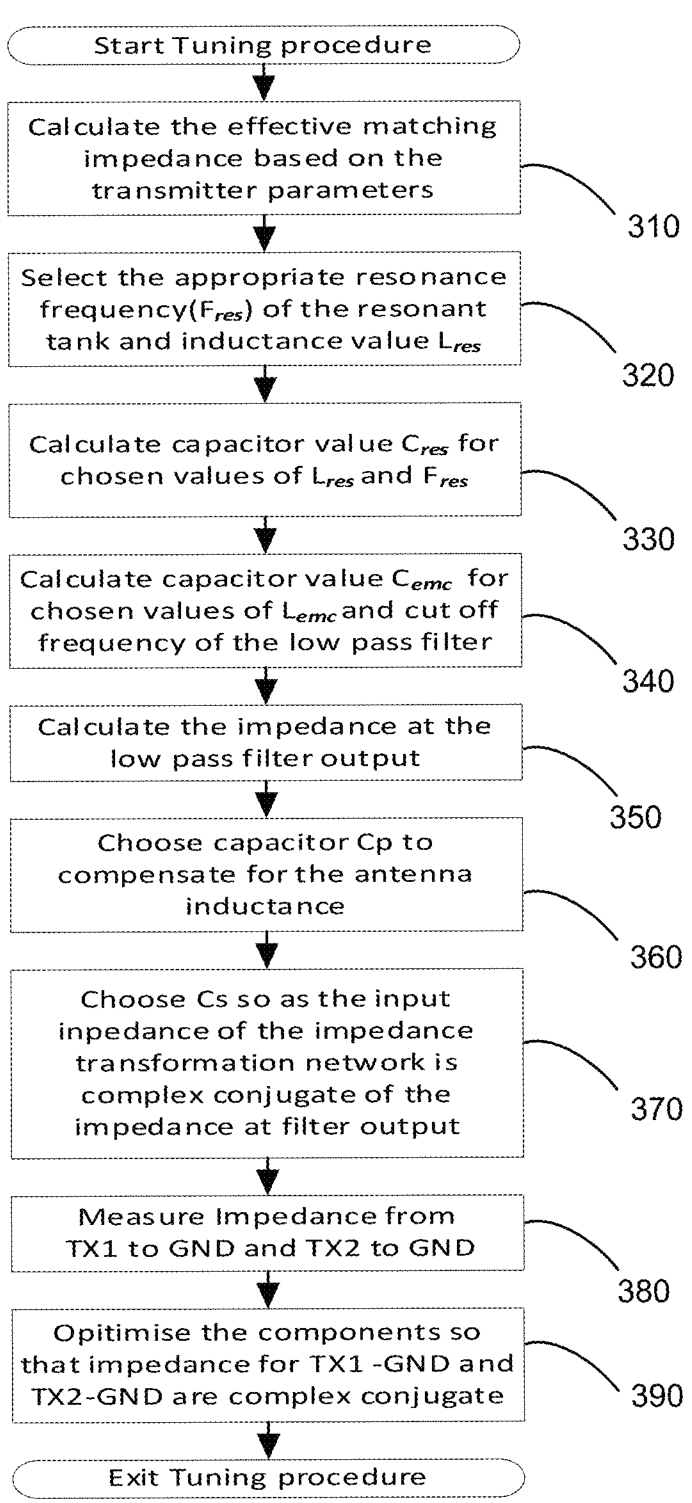
FIG. 3 is a flow chart illustrating an exemplary set of activities and/or data flow for implementing a circuit topology or architecture of the type shown in FIG. 1A, FIG. 1B or FIG. 1C, in accordance with the present disclosure.

FIG. 3 is a flow chart illustrating an exemplary set of activities and/or data flow for implementing a circuit topology or architecture of the type shown in FIG. 1A, FIG. 1B or FIG. 1C, in accordance with the present disclosure. The tuning procedure effectively starts at block (aka step) 310 where a calculation is made to determine the effective matching impedance based on the signal driver (or transmitter) parameters. Such parameters may be given based on the design requirements and/or the specifications of a chosen NFC circuit as may be applicable. The target matching impedance $Z_{MATCH}$ may be calculated based on Transmitter parameter, for example for a transmitter having output resistor RON producing a square wave output with voltage VDDPA (V) and average current $I_{VDDPAavg}$, with $Z_{MATCH}$ being equal to:

$$(VDDPA/IVDDPAavg \times 8/(\pi^2 * \sin\beta)) - 2*R_{ON}.$$

Next, the resonance frequency and related component values are chosen for delivering a signal with the appropriate frequency to the load. At block 320 the appropriate resonance frequency (Fres) is selected for the resonant tank circuit and the inductive component value $L_{res}$, and this is followed, as indicated at block 330, by a calculation of the capacitor value Cres for the chosen values of $L_{res}$ and Fres. For example, the capacitor value Cres may be calculated as being equal to $1/(2\pi Fres)^2 * L_{res}$.

From block 330, flow proceeds to block 340 where a calculation of the capacitor value $C_{emc}$ for chosen values of $L_{emc}$ and cut-off frequency of the low pass filter (if a low pass filter is used). As shown in each of FIG. 1B and FIG. 1C, the filter may be implemented using such components $C_{emc}$ and $L_{emc}$. From block 340, flow proceeds to block 350 where a calculation is made regarding the impedance at the output of the low pass filter. At block 360, an appropriate capacitance is chosen for the capacitor $C_P$ to compensate for inductance which manifests through use of the antenna.

Following block 360, Cs is chosen at block 370 so that the input impedance of the impedance transformation network is a complex conjugate of the impedance at the output of the filter, and this involves capacitor $C_P$ and capacitor $C_S$. The values of $C_S$ and $C_P$ may be chosen so that $C_P$ in parallel with $Z_{ant}$ (where $Z_{ant}$ is equivalent input impedance of the antenna segment) which in series with $C_S$, is matched as a complex conjugate to the output impedance at the low pass filter $[Z_{tr}]$; that is $(C_P \| Z_{ant}) \longleftrightarrow C_S = Z_{tr}$.

After block 370, block 380 shows the next step as impedance measurements being made from the respective outputs of the NFCC to ground (e.g., from TX1 to ground and TX2 to ground).

The final step depicted in the example shown in FIG. 3 is at block 390, where component-value optimization may be carried out so that the impedance for TX1 to ground and TX2 to ground are complex conjugates. However, after such tuning the receiver tap point may be connected in the single ended part of the matching network for optimum receiver performance, and the values for resistor Rrx and capacitor Crx are calculated accordingly based on the tap point selected.

According to certain examples consistent with the present disclosure, the inductance value for the inductor $L_{res}$ (of the resonant tank circuit) may be selected according to certain inductance selection criteria. With the disclosed topology, the effective impedance presented to the TX output of the signal driver (e.g., TX1 and TX2) is always complex, and the goal of the above-described tuning process is to have a complex conjugate load presented to TX1 and TX2, meaning $Z_{matchTX1\text{-}GND} = Z^*_{matchTX2\text{-}GND}$. Depending on the $Z_{match}$, the value of $L_{res}$ may be chosen with the relationships being shown such that: for a given $L_{res}$ value there is only one maxima for $Re[Z_{match}]_{TX1/2\text{-}GND}$ corresponding to resistive load at TX1-TX2 combiner point, and this indicates that for a higher TX matching impedance ($Z_{match}$), a larger $L_{res}$ value is to be used. In one experimental example also consistent with the present disclosure, such TX matching impedance $(Z_{match})*Re[Z_{match}]_{TX1/2\text{-}GND}$ at combiner point) were measured and confirmed for $L_{res}$ values of 74.6 nH, 91 nH and 130 nH. In similar testing, the frequency response at the receiver input with $L_{res}$ 75 nH, 91 nH and 135 nH were assessed, and the TX matching impedance $|Z_{match}|\sim 4.7$ ohms (which is the maximum impedance achievable with $L_{res}$=75 nH) and $L_{emc}$ coil is the same for all values of $L_{res}$. It should be noted that with an increased $L_{res}$, the overall bandwidth at the receiver results in a reduction and thus for large $L_{res}$ values the sideband level would be attenuated which in turn leads to lower sensitivity.

As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals used FIGS. 1A, 1B and 2) depict a block/module as described herein. Such circuits or circuitry may be used together with other elements to exemplify how certain embodiments can be carried out in the form or structures, steps, functions, operations, activities, etc. As examples, wherein such circuits or circuitry may correspond to logic circuitry (which may refer to or include a code-programmed/configured CPU), in one example the logic circuitry may carry out a process or method (sometimes "algorithm") by performing a first named activity and a second named activity, and in another example, the logic circuitry may carry out a process or method by performing these same activities/operations. Yet another process or method in this context would be recognized in connection with the functions/activities associated with FIG. 3 that the various calculations may be made in different orders than what has been described.

For example, in certain of the above-discussed embodiments, one or more modules are discrete logic circuits or programmable logic circuits configured and arranged for implementing these operations/activities, as may be carried out in the approaches shown in FIGS. 1A, 1B and 1C. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with FIG. 3 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . "). Further, in the electrical-engineering contexts of the present disclosure it will be appreciated that "transceiver" refers to or includes a communication circuit which is designed to transmit, receive, or both receive and transmit signals, and that certain terms such as "to" and "coupled" are to be construed in a general sense (e.g., with "to" referring to or including, as an example, "towards", and with "coupled" referring to or including, as examples, connected directly or indirectly such as coupling a signal via one or more wires, through an amplifier and/or wirelessly).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:

a resonance tank circuit, having a resonance frequency set for a transfer of power from a signal source, for conversion between a plurality of complementary signals and a signal at a node for carrying the signal towards a single-ended circuit, wherein the single-ended circuit includes or corresponds to an antenna, and the resonance tank circuit is to convert the plurality of complementary signals for the transfer of power to an antenna while the resonance tank circuit transforms a source side of the resonance tank circuit, having a low voltage and low impedance source, to an equivalent high voltage high impedance node at a tap point on an output side of the resonance tank circuit.

2. The apparatus of claim 1, wherein the plurality of complementary signals are differential signals.

3. The apparatus of claim 1, further including a single-ended circuit, coupled to the resonance tank circuit, including or corresponding to an antenna.

4. The apparatus of claim 1, further including a single-ended circuit, coupled to the resonance tank circuit, including or corresponding to an active signal-receiving circuit.

5. The apparatus of claim 1, further including a radio-frequency communication circuit to communicate modulated signals via the antenna, wherein the antenna includes a single-ended antenna and the resonance tank circuit is to facilitate conversion of the plurality of complementary signals to the signal at the node without using a balun to effect the conversion.

6. An apparatus comprising a resonance tank circuit, having a resonance frequency set for a transfer of power from a signal source, for conversion between a plurality of complementary signals and a signal at a node for carrying the signal towards a single-ended circuit, further including a NFC (near-field communication) circuit having a port for receiving a single-ended signal coupled to a tap point in a path that is connected to the resonance tank circuit, and having a pair of differential signal outputs providing the plurality of complementary signals, wherein an effective complex impedance is presented to the pair of differential signal outputs, and the apparatus further includes setting or tuning values of components via an impedance matching process to cause a complex conjugate load presented to the pair of differential signal outputs, whereby $Z_{matchTX1\text{-}GND}$ is equal to $Z^*_{matchTX2\text{-}GND}$.

7. The apparatus of claim 1, wherein the resonance tank circuit is to convert the plurality of complementary signals while different ones of the plurality of complementary signals are not aligned with one another by a certain differential phase.

8. The apparatus of claim 1, wherein the resonance tank circuit is to convert the plurality of complementary signals while different ones of the plurality of complementary signals are not similarly shaped.

9. The apparatus of claim 1, wherein the antenna is to provide the plurality of complementary signals as a set of differential signals, the single-ended circuit is to receive converted energy responsive to conversion by the resonance tank circuit.

10. The apparatus of claim 1, further including signal-filtering circuitry in a signal path coupled to the resonance tank circuit, and a signal driver as part of the signal source to transmit or provide the plurality of complementary signals as a set of differential signals, the antenna and the resonance tank circuit are configured for wirelessly transmitting an NFC (near-field communication) signal from the antenna.

11. The apparatus of claim 1, further including a signal driver to transmit or provide the plurality of complementary signals as a set of at least two signals to be combined using the resonance tank circuit.

12. The apparatus of claim 1, wherein the resonance tank circuit is set or tuned for a transformation of power from the plurality of complementary signals to the single-ended circuit.

13. The apparatus of claim 1, wherein the resonance tank circuit is to convert the plurality of complementary signals, while the plurality of complementary signals is in balanced form, to the node at which the signal is in an unbalanced form.

14. The apparatus of claim 1, wherein the signal source is part of a radio-frequency communication device to send and/or receive modulated signals communicated via the single-ended circuit, and the single-ended circuit is to wirelessly facilitate or effect communication of NFC (near-field communication) signals.

15. The apparatus of claim 1, further including a signal driver and signal-conditioning circuitry, including at least one of a filter and an impedance transformation network, wherein the signal driver is integrated with a NFC (near-field communication) circuit which has at least one input port at which to receive feedback from a signal downstream relative to output signals of an NFC transmitter.

16. The apparatus of claim 1, further including a NFC (near-field communication) circuit having a port for receiving a single-ended signal coupled to a tap point in a path that is connected to the resonance tank circuit, and having a pair of differential signal outputs providing the plurality of complementary signals, wherein an effective complex impedance is presented to the pair of differential signal outputs, and the apparatus further includes setting or tuning values of components via an impedance matching process to cause a complex conjugate load presented to the pair of differential signal outputs, whereby $Z_{matchTX1-GND}$ is equal to $Z^*_{matchTX2-GND}$.

17. An apparatus comprising:

a parallel-arrangement of resonance tank circuits including a first resonance tank circuit having a resonance frequency set for a transfer of power from a signal source, for conversion between a plurality of complementary signals and a signal at a first node for carrying the signal towards a first single-ended circuit;

a second resonance tank circuit having a resonance frequency set for a transfer of power from a signal source, for conversion between a plurality of complementary signals and a signal at a second node for carrying the signal towards a second single-ended circuit, wherein at least one of the first single-ended circuit or the second single-ended circuit includes or corresponds to an antenna, and that at least one of the first resonance tank circuit or the second resonance tank circuit is to convert the plurality of complementary signals for the transfer of power to an antenna while at least one of the first resonance tank circuit or the second resonance tank circuit transforms a source side of at least one of the first resonance tank circuit and the second resonance tank circuit, having a low voltage and low impedance source, to an equivalent high voltage high impedance node at a tap point on an output side of at least one of the first resonance tank circuit or the second resonance tank circuit; and a transceiver circuit that functions as a source of the plurality of complementary signals for the first resonance tank circuit and functions as a load to receive a single-ended signal from an output of the second one of the resonance tank circuits.

18. A method comprising:

converting, via a resonance tank circuit having a resonance frequency set for a transfer of power in the plurality of complementary signals, between a plurality of complementary signals and a signal at a node, and carrying the signal towards a single-ended circuit, wherein the single-ended circuit includes or corresponds to an antenna, and the resonance tank circuit is to convert the plurality of complementary signals for the transfer of power to an antenna while the resonance tank circuit transforms a source side of the resonance tank circuit, having a low voltage and low impedance source, to an equivalent high voltage high impedance node at a tap point on an output side of the resonance tank circuit.

19. The method of claim 18, wherein the antenna includes a single-ended antenna and the resonance tank circuit has an output coupled to a single-ended circuit that includes signal-conditioning circuitry.

20. The method of claim 18, wherein the resonance tank circuit has an output coupled to a single-ended circuit, wherein the single-ended circuit includes a single-ended receiver.

* * * * *